United States Patent
Khandros et al.

(10) Patent No.: US 7,550,842 B2
(45) Date of Patent: Jun. 23, 2009

(54) INTEGRATED CIRCUIT ASSEMBLY

(75) Inventors: Igor Y. Khandros, Orinda, CA (US); Benjamin N. Eldridge, Danville, CA (US); Charles A. Miller, Fremont, CA (US); A. Nicholas Sporck, Saratoga, CA (US); Gary W. Grube, Pleasanton, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 118 days.

(21) Appl. No.: 10/317,661

(22) Filed: Dec. 12, 2002

(65) Prior Publication Data

US 2004/0113250 A1 Jun. 17, 2004

(51) Int. Cl.
*H01L 23/34* (2006.01)

(52) U.S. Cl. .............. 257/723; 257/E23.175; 257/734; 257/776; 361/760; 361/761; 174/260

(58) Field of Classification Search .............. 257/672, 257/676, 685, 688, 680, E23.011, 776, 723, 257/668, E23.004, E23.039, E23.175, E23.177, 257/E25.012, 679, 787, 734, 690; 361/760, 361/761, 764; 174/260
See application file for complete search history.

(56) References Cited

U.S. PATENT DOCUMENTS

| | | | |
|---|---|---|---|
| 4,996,587 A | 2/1991 | Hinrichsmeyer et al. | |
| 5,241,456 A * | 8/1993 | Marcinkiewicz et al. | 361/792 |
| 5,243,497 A | 9/1993 | Chiu | |
| 5,280,192 A * | 1/1994 | Kryzaniwsky | 257/723 |
| 5,373,188 A | 12/1994 | Michii et al. | |
| 5,602,421 A * | 2/1997 | Li | 257/728 |
| 5,723,907 A * | 3/1998 | Akram | 257/723 |
| 5,811,879 A | 9/1998 | Akram | |
| 5,818,698 A * | 10/1998 | Corisis | 361/760 |
| 5,821,605 A * | 10/1998 | Hong et al. | 257/666 |
| 5,854,740 A * | 12/1998 | Cha | 361/760 |
| 5,998,860 A * | 12/1999 | Chan et al. | 257/679 |
| 5,998,865 A * | 12/1999 | Akram | 257/723 |
| 6,049,129 A * | 4/2000 | Yew et al. | 257/737 |
| 6,198,162 B1 | 3/2001 | Corisis | |
| 6,214,641 B1 * | 4/2001 | Akram | 438/107 |
| 6,219,908 B1 | 4/2001 | Farnworth et al. | |
| 6,249,052 B1 * | 6/2001 | Lin | 257/737 |
| 6,271,586 B1 * | 8/2001 | Shen | 257/723 |
| 6,351,028 B1 * | 2/2002 | Akram | 257/686 |
| 6,387,732 B1 * | 5/2002 | Akram | 438/123 |
| 6,404,660 B1 | 6/2002 | Gamini et al. | |
| 6,429,514 B2 * | 8/2002 | Shen | 257/723 |
| 6,445,077 B1 * | 9/2002 | Choi et al. | 257/786 |

(Continued)

FOREIGN PATENT DOCUMENTS

EP 0413451 A 2/1991

(Continued)

*Primary Examiner*—Chris C. Chu
(74) *Attorney, Agent, or Firm*—N. Kenneth Burraston

(57) ABSTRACT

In an integrated circuit assembly, know good die (KGD) are assembled on a substrate. Interconnect elements electrically connect pads on a die attached to the substrate to traces or other electrical conductors on the substrate or to pads on another die attached to the substrate. The substrate may have one or more openings, exposing pads of the die. The assembly may comprise one or more dice.

21 Claims, 10 Drawing Sheets

U.S. PATENT DOCUMENTS

| | | | |
|---|---|---|---|
| 6,445,594 B1 * | 9/2002 | Nakagawa et al. | 361/776 |
| 6,667,560 B2 | 12/2003 | Goh | |
| 6,670,707 B2 * | 12/2003 | Shen | 257/734 |
| 6,683,377 B1 * | 1/2004 | Shim et al. | 257/723 |
| 6,706,624 B1 * | 3/2004 | Kapusta et al. | 438/622 |
| 6,707,141 B2 * | 3/2004 | Akram | 257/686 |
| 6,740,984 B2 | 5/2004 | Tay et al. | |
| 6,743,658 B2 * | 6/2004 | Corisis | 438/106 |
| 6,777,268 B2 | 8/2004 | Jiang | |
| 6,803,254 B2 * | 10/2004 | Park et al. | 438/109 |
| 6,835,592 B2 * | 12/2004 | Hall et al. | 438/106 |
| 6,917,107 B2 * | 7/2005 | Akram | 257/738 |
| 6,939,739 B2 * | 9/2005 | Corisis | 438/108 |
| 6,979,598 B2 * | 12/2005 | Jiang et al. | 438/118 |
| 2001/0002321 A1 | 5/2001 | Castro | |
| 2001/0026008 A1 * | 10/2001 | Tsuneda et al. | 257/668 |
| 2002/0025608 A1 | 2/2002 | Shinonaga et al. | |
| 2002/0043709 A1 * | 4/2002 | Yeh et al. | 257/686 |
| 2002/0059911 A1 | 5/2002 | Takahashi et al. | |
| 2002/0081755 A1 * | 6/2002 | Degani et al. | 438/14 |
| 2002/0142494 A1 * | 10/2002 | Farnworth et al. | 438/14 |
| 2002/0197772 A1 * | 12/2002 | Jiang et al. | 438/118 |
| 2004/0041166 A1 * | 3/2004 | Morrison | 257/117 |
| 2004/0061209 A1 * | 4/2004 | Tsai et al. | 257/680 |
| 2005/0006748 A1 * | 1/2005 | Eng et al. | 257/690 |

FOREIGN PATENT DOCUMENTS

EP 0590915 4/1994

* cited by examiner

INTEGRATED CIRCUIT ASSEMBLY

FIELD OF THE INVENTION

The present invention relates to integrated circuits, and more specifically, to an integrated circuit assembly using know good dice on a substrate.

BACKGROUND OF THE INVENTION

Integrated circuits can include a semiconductor die mechanically attached and electrically connected to a leads-over-chip (LOC) lead frame. The die and lead frame are typically encapsulated within a transfer-molded plastic package, ceramic package or metal package. Manufacturing efficiencies can be achieved and costs can be lowered by using known good dice (KGD's) instead of packaged dice. KGD's are unpackaged dice that have been subjected to tests and/or burn-in and are generally considered to have the same quality and reliability as otherwise equivalent packaged dice.

What is desired is an integrated circuit assembly and method for making such assembly using know good dice wherein performance is enhanced and manufacturing costs are minimized.

SUMMARY OF THE INVENTION

Generally speaking, there is provided an improved integrated circuit assembly using know good die (KGD) on a substrate. Interconnect elements electrically connect pads on the die to traces or other electrical conductors or to pads on other die.

DESCRIPTION OF THE PREFERRED EMBODIMENT

Figure 1:
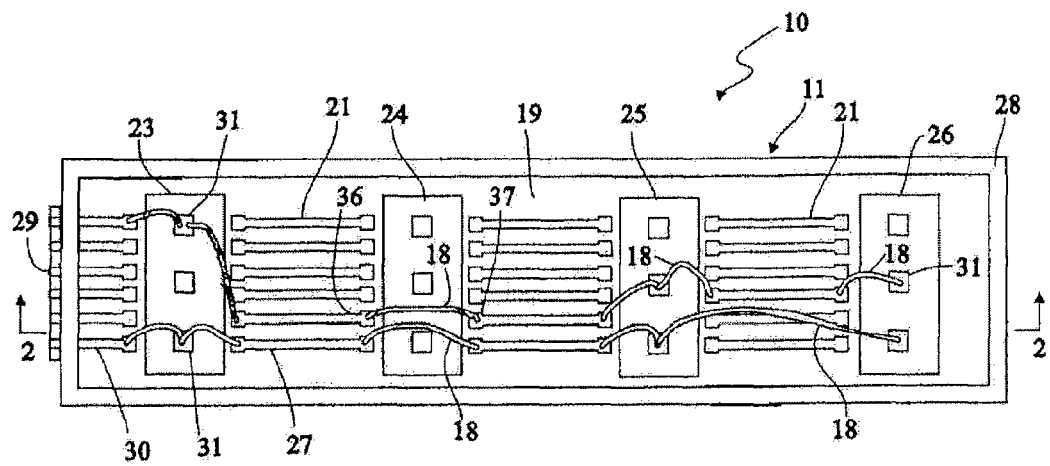
FIG. 1 is a plan view of an integrated circuit assembly 10 in accordance with one embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, and any alterations or modifications in the illustrated device, and any further applications of the principles of the invention as illustrated therein are contemplated as would normally occur to one skilled in the art to which the invention relates.

Figure 2:
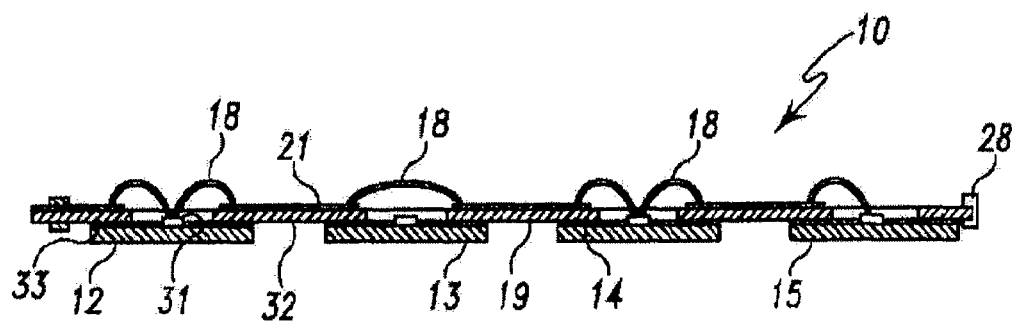
FIG. 2 is a side, cross-sectional view of the integrated circuit assembly 10 of FIG. 1, taken along the lines 2-2 and viewed in the direction of the arrows.

Referring to FIGS. 1 and 2, there is shown an integrated circuit assembly 10 in accordance with one embodiment of the present invention. Assembly 10 generally includes a substrate 11, a plurality of dice, preferably previously tested known good dice (KGD) 12-15, and interconnectors such as a plurality of bond wires 18. Substrate 19 may be any substrate suitable for an assembly of dice, including without limitation printed circuit board, ceramic, plastic, flex circuit, etc. It should be noted that the substrate 19 may be ground or polished before or after final assembly of all of the integrated circuits onto the substrate to thin the substrate. Traces 21, in various combinations, form a bus for providing power, ground, and signals such as data, address, control, etc. to one or more KGD's connected with substrate 19. Substrate 19 defines a plurality of spaced openings 23-26 that interrupt traces 21 at numerous locations. The openings may be a variety of sizes and shapes, and may be completely surrounded or only partially surrounded or defined around their perimeter by the substrate. Certain of the traces 21 thus extend between adjacent sets of the openings 23-26, as shown, and are referred to as central traces 27. It is preferred that the groups of traces (i.e. the group of five traces that run between openings 24 and 25 or the group of five that run from opening 23 and outwardly there from) run side-by-side, substantially parallel and in substantially the same length. An edge stiffener 28 maybe connected to or applied to a sufficient portion of substrate 19 to provide strength thereto. In the embodiment of FIG. 1, edge stiffener 28 comprises a pair of mating metallic strips (one above and one below) that surround the periphery of substrate 19, as shown. Certain of the traces 21 extend outwardly of substrate 19 at an edge thereof to form connectors 29 for external connection to a higher level circuit. Traces extending outwardly at an edge of substrate 19 are referred to as edge traces 30. Edge traces 30 extend through stiffener 28. Stiffener 28 may be sized and configured to act as a heat sink. It may be any size, shape or composition, including rods, plates, perimeter frames (complete or partial) or otherwise. If substrate 19 is thin (e.g., a flexible film such as a flex circuit material), stiffener 28 helps the otherwise flexible film substrate, which would otherwise deflect from the weight of the dice, maintain a substantially planar configuration. As mentioned above, however, flex is but one example of a substrate. If a more rigid substrate is used (e.g., printed circuit board material), a stiffener may not be needed.

As discussed in U.S. Pat. Nos. 6,214,641 B1 and 6,219,908 B1, which are hereby incorporated by reference, known good dice (KGD) connotes unpackaged dice that have been subjected to tests and/or burn-in and are thus considered to have the same general quality and reliability as otherwise equivalent packaged dice. Such KGD's may be secured to a substrate to create a multi-chip module for use in computers, telecommunication devices, vehicles, watches, appliances, and a seemingly unlimited variety of other electronic devices. In the assembly 10 of FIG. 1, each KGD 12-15 includes one or more electrical die contacts or die pads 31. Each die pad 31 serves as the electrical connection point (e.g. for ground, power and signal connection) for its KGD. The die pads may take any appropriate form and number, as dictated by the design of the particular die. KGD's 12-15 are secured to the bottom side 32 of substrate 19 (as viewed in FIG. 2) so that die pads 31 are disposed within corresponding openings 23-26, that is, accessible through the openings from the upper surface of substrate 19. KGD's 12-15 are secured to substrate 19 by any standard and appropriate means such as with an adhesive 33. Using standard bonding techniques, wires 18 are bonded from traces 21 to die pads 31 and/or from one trace end 36 to another trace end 37 to jump across an opening 24. Proximal to openings 23-26, each trace end (i.e. 36 and 37) may be enlarged to facilitate wire bonding, and the wires are preferably bonded at such trace ends. However, it is contemplated that one or more wires 18 may be bonded at any point along a trace as necessary or desired to achieve a certain electrical configuration.

Figure 3:
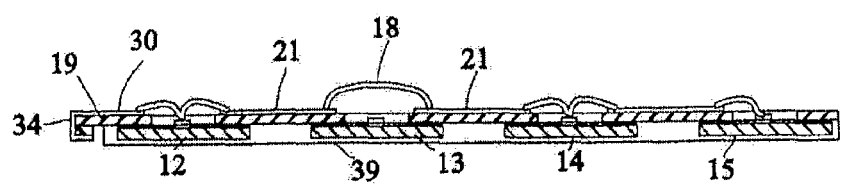
FIG. 3 is a side, cross-sectional view of an alternative embodiment of the integrated circuit assembly 10 of FIG. 1.

FIG. 3 shows an alternative embodiment wherein a stiffener material 39 (and heat sink) is applied to just the bottom, die side of substrate 19, which in this example is a flex circuit, and where the flex circuit extends to, and wraps around itself or a small inserted substrate (not shown) at its outer edge 34 to provide an alternative connection surface for connection to a higher level circuit.

Figure 4:
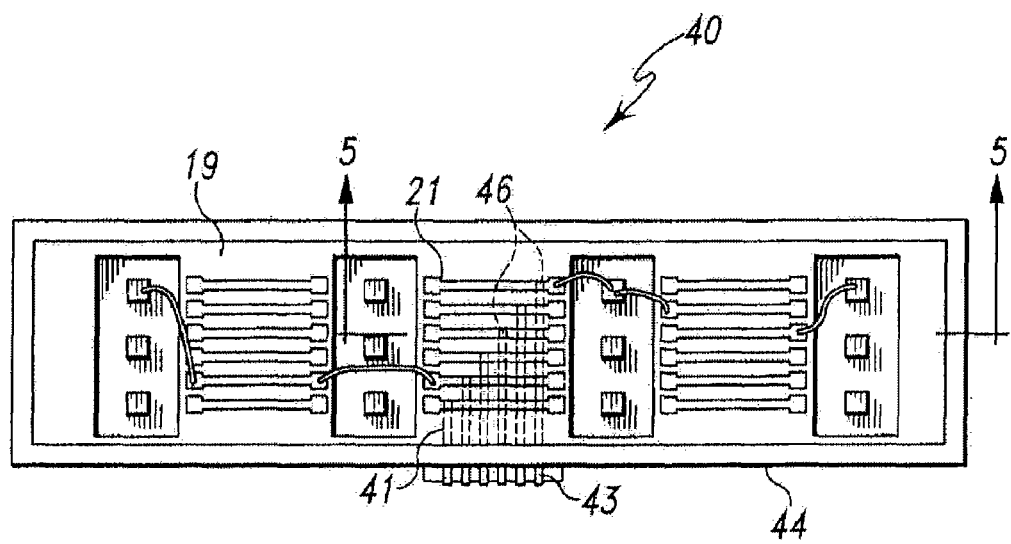
FIG. 4 is a plan view of an integrated circuit assembly 40 in accordance with another embodiment of the present invention.
Figure 5:
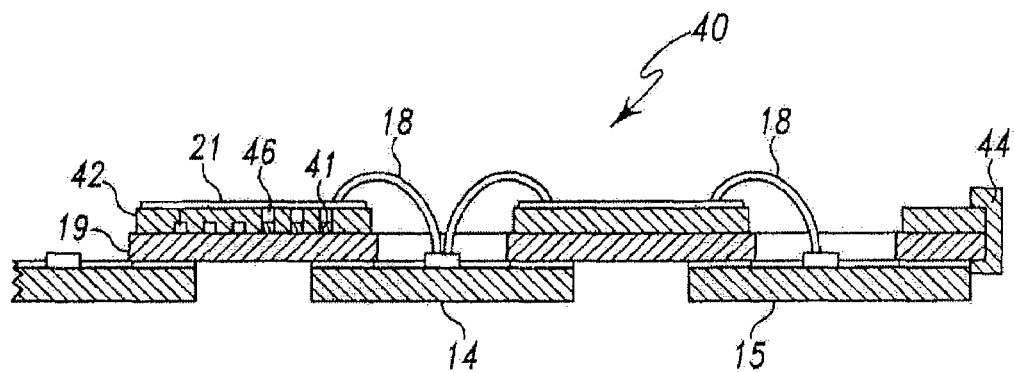
FIG. 5 is a side, cross-sectional view of the integrated circuit assembly 40 of FIG. 4, taken along the lines 5-5 and viewed in the direction of the arrows.

Referring to FIGS. 4 and 5, there is shown an integrated circuit assembly 40 in accordance with an alternative embodiment wherein there are two layers of traces 21 and 41 mounted to substrate 19. Traces 41 pass are embed in insulative layer 42, the insulative layer 42 electrically separating traces 21 and 41. The upper layer of traces 21 extend longitudinally, as in the embodiment of FIG. 1, but the lower layer of traces 41 extends laterally or generally orthogonally to traces 21. The outboard ends of traces 41 extend outwardly of substrate 19 and stiffener 44, along with and on top of a portion of substrate 19, to form connectors 43. Vias 46 extend through substrate 19 to provide connection between the upper, longitudinal traces 21 and the lower, transverse traces 41. Such longitudinal and transverse horizontal traces and vertical vias may be provided in any part of the substrate 19 to create elaborate multi-layer circuit configurations. For example, continuous longitudinal traces could be run in one layer above and/or below the openings 23-26 in substrate 19, and vertical vias run in another layer from the longitudinal traces to the surface regions between the openings, from which wires could be bonded from the vias to the die pads. Transverse traces are described to run generally orthogonally to longitudinal traces 21. However, the second, lower traces 41 could extend at other than a ninety-degree angle from upper traces 21 and may not be mutually parallel. The second (and possibly third and fourth trace layers, etc.) must simply be mutually exclusive from the first, upper trace layer.

Figure 6:
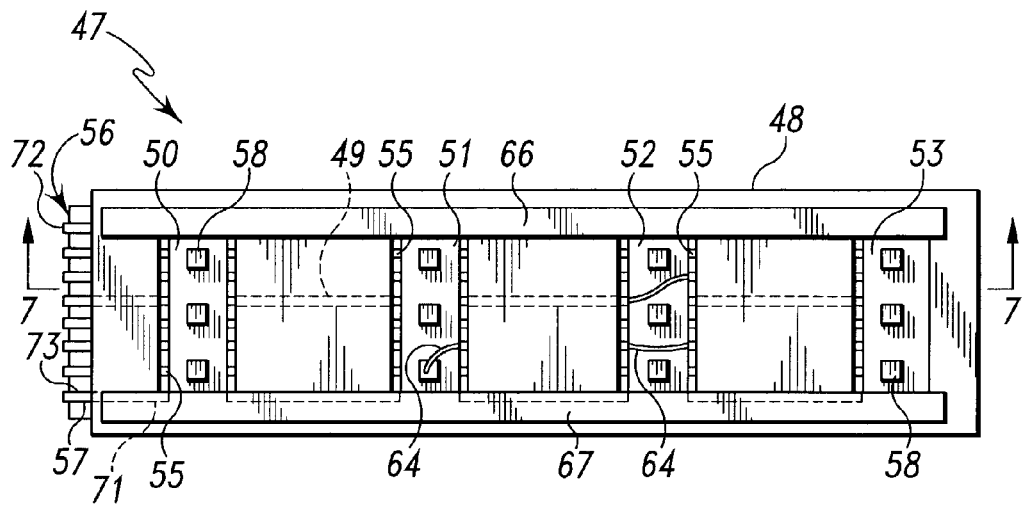
FIG. 6 is a plan view of an integrated circuit assembly 47 in accordance with another embodiment of the present invention.
Figure 7:
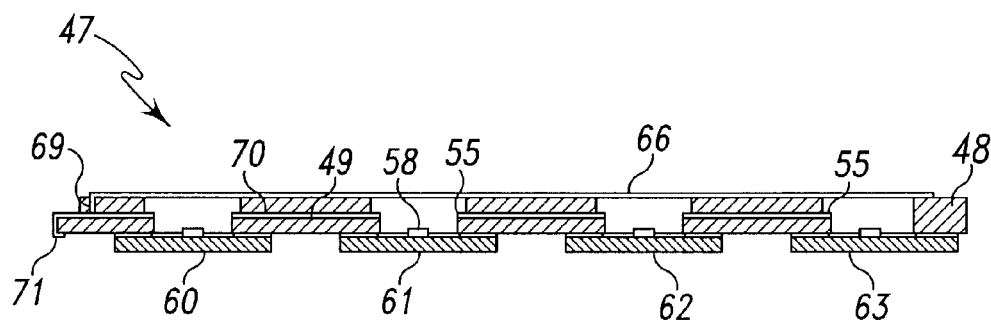
FIG. 7 is a side, cross-sectional view of the integrated circuit assembly 47 of FIG. 6, taken along the lines 7-7 and viewed in the direction of the arrows.
Figure 8:
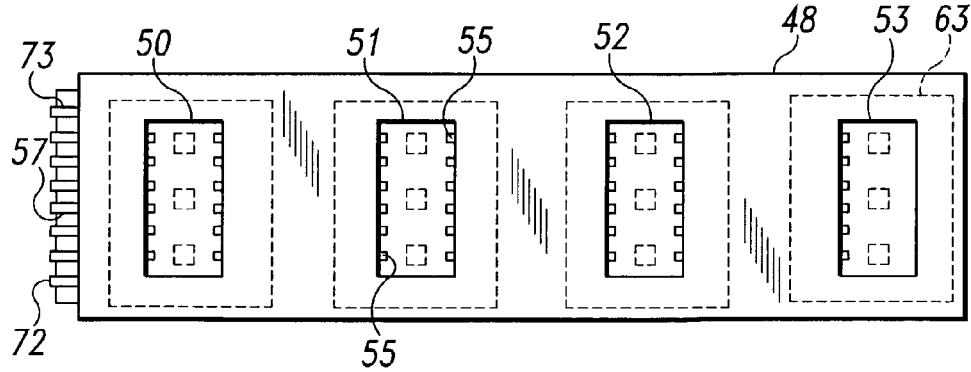
FIG. 8 is a bottom view of the integrated circuit assembly 47 of FIG. 6.

Referring to FIGS. 6-8, an integrated circuit assembly 47 in accordance with an alternative embodiment is shown wherein the substrate 48 is multilayered. Bus traces 49 (FIG. 7 and one shown in phantom in FIG. 6) are embedded within substrate 48 and, like traces 21, are broken up by openings 50-53. The ends of the majority traces 49 each extend into one of the openings 50-53 to form bond tips 55. At one end 56, traces 49 extend outwardly atop a portion of substrate 48 to form connectors 57 for connection to a higher level circuit. As with integrated circuit assembly 10, wires 64 can be bonded from bond tips 55 to the die pads 58 of KGD's 60-63 mounted to the underside of substrate 48, or from one bond tip 55 to another bond tip 55. Assembly 47 is further provided with ground and power plane traces 66 and 67, respectively, which extend on top of and along the length of substrate 48. Ground and power traces 66 and 67 may be connected by vias and into substrate 48 (as shown at 69 for ground trace 66), each to connect with a respective horizontal trace 49 to form horizontal, imbedded ground and power traces (only ground trace 70 shown). At end 56 of substrate 48, the ground and power traces extend outwardly of substrate 48 to form ground and power connectors 72 and 73, for connection to a higher level circuit.

Optional resistors (in any form) at or near the terminal ends of the buses may be provided to prevent or reduce signal reflection. The resistors may be connected to a trace by a bonded wire or other interconnect element. The resistors may optionally be connected to ground. Also wires, traces, shields, films or otherwise may be located between or around the traces to prevent or reduce electrical or other signal interference between or among traces or other conductors in the assembly.

Alternative embodiments are contemplated wherein the ground and power plane traces 66 and 67 turn down (as at 69) into substrate 48, and then turn directly outwardly and out of substrate 48 at end 56 to form the ground and power connectors 72 and 73, and without a ground or power trace 70 or 71.

Alternative embodiments are contemplated wherein ground and power are provided solely by ground and power traces 70 and 71, which terminate in edge connectors 71 and 72, and no ground or power plane traces 66 and 67 are provided.

Alternative embodiments are contemplated wherein ground and power plane traces 66 and 67 are replaced by bus traces (like traces 21 in FIG. 1), with or without embedded ground and/or power 70 and 71 traces.

Alternative embodiments are contemplated wherein bus traces are provided on the outer surface(s) of substrate 48 (like traces 21 of FIG. 1 and other figures herein), that may be connected using wires bonded thereto to provide power, ground or signals, as desired. Such surface-mounted bus traces may be provided instead of or in addition to any of the imbedded traces or surface planes described herein.

Figure 9:
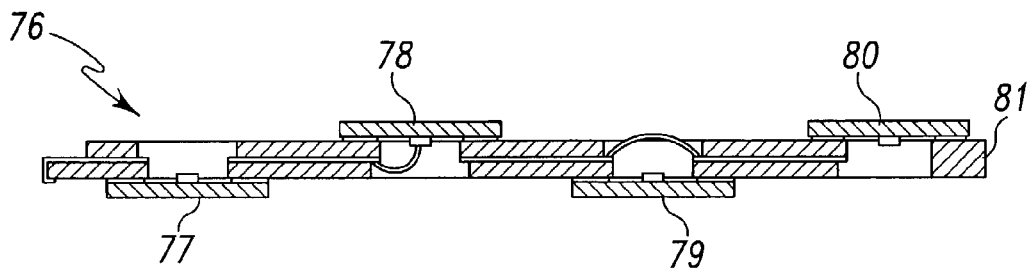
FIG. 9 is a side, cross-sectional view of an integrated circuit assembly 76 in accordance with another embodiment of the present invention.

Referring to FIG. 9, there is shown an alternative embodiment integrated circuit assembly 76 wherein KGD's 77-80 are mounted on both sides of a substrate 81.

Figure 10:
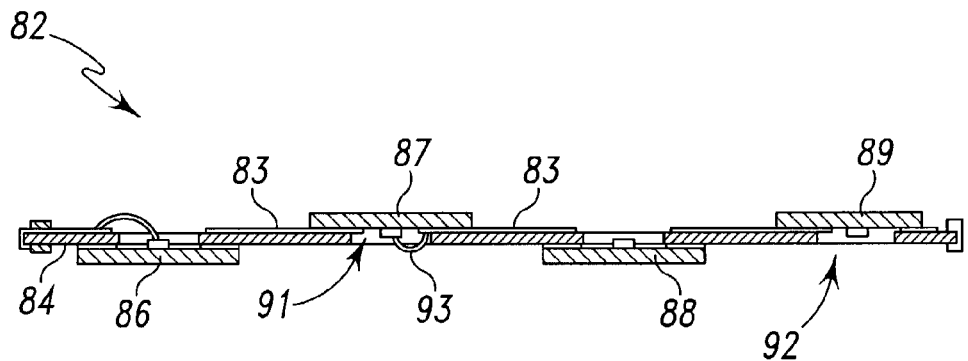
FIG. 10 is a side, cross-sectional view of an integrated circuit assembly 82 in accordance with another embodiment of the present invention.

Referring to FIG. 10 there is shown an alternative embodiment integrated circuit assembly 82 wherein bus traces 83 are surface-mounted to a substrate 84, as in assembly 10 of FIGS. 1 and 2. The KGD's 86-89 are surface-mounted on opposing sides of substrate 84, at least one such KGD being mounted directly on top of surface-mounted traces 83. To accommodate the KGD's 87 and 89 mounted thereon, some of traces 83 extend into the corresponding openings 91 and 92, as shown, to permit wires 93 to be bonded thereto. Alternatively, multilevel traces could be used as described with respect to integrated circuit assembly 40 of FIGS. 4 and 5. For example, continuous horizontal traces could be run in one layer above and/or below the openings in the substrate, and vertical traces could run in another layer, extending from the horizontal traces and into the regions between the openings, from which bond wires would be bonded from the vertical traces to the die pads. Such trace arrangement could be provided on one or both sides of the substrate.

Figure 11:
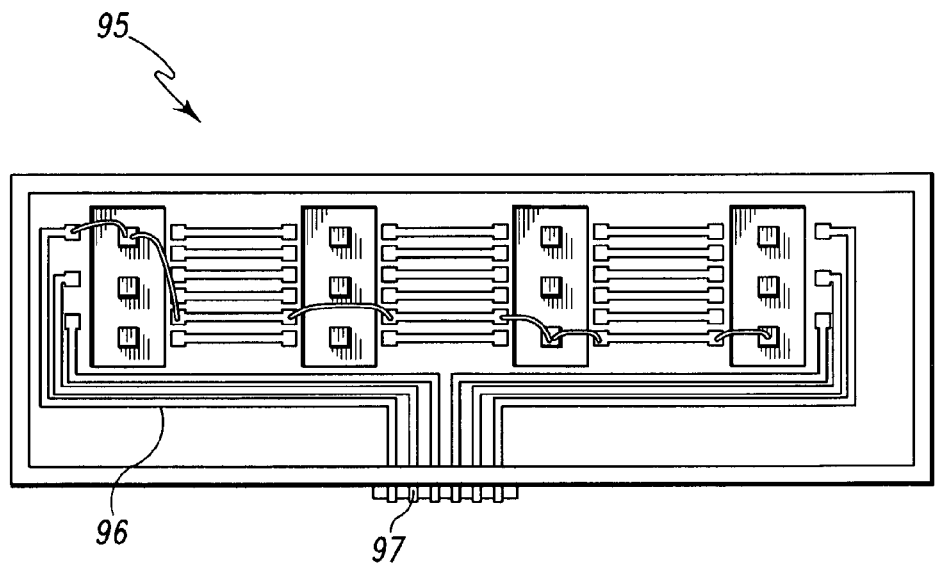
FIG. 11 is a plan view of an integrated circuit assembly 95 in accordance with another embodiment of the present invention.

Referring to FIG. 11, there is shown an alternative embodiment integrated circuit assembly 95 wherein a plurality of edge traces 96 extend outwardly from the outer openings, wrap around to a mid point along the substrate and extend outwardly there from along the side edge to form side edge connectors 97.

Embodiments are contemplated wherein various aspects of the embodiments disclosed in FIGS. 1-11 are combined in combinations not specifically disclosed. For example, and without limitation, the embodiment of FIG. 11 may include KGD'S mounted on both the top and bottom surface of the substrate and/or may include two or more different trace layers. Embodiments are contemplated wherein various forms of stiffeners, covers and/or other appropriate protective materials (such as the non-conductive glob tops 66 disclosed in U.S. Pat. No. 6,214,641, which has been incorporated herein by reference) are applied to and/or around the substrates to strengthen and protect the substrate, KGD's, traces, wiring, etc. Embodiments are contemplated wherein the substrate is comprised of any appropriate material to support the KGD'S, wiring and related components and withstand handling and whatever wear and tear is contemplated. Such materials include, but are not limited to, flex, silicon, ceramic, epoxies, polyamides, Teflon, fluoropolymers, and other organic or dielectric materials.

Figure 12:
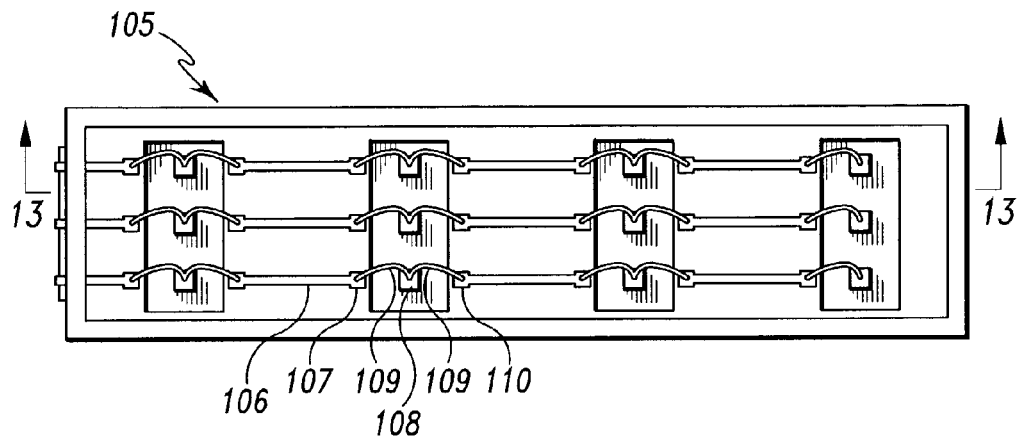
FIG. 12 is a plan view of an integrated circuit assembly 105 in accordance with another embodiment of the present invention.
Figure 13:
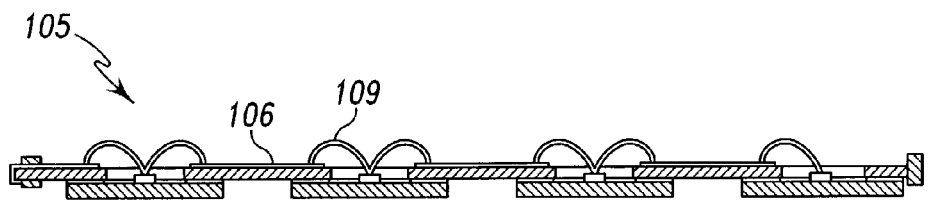
FIG. 13 is a side, cross-sectional view of the integrated circuit assembly 105 of FIG. 12, taken along the lines 13-13 and viewed in the direction of the arrows.

Referring to FIGS. 12 and 13, there is shown an exemplary configuration of an integrated circuit assembly 105 wherein the traces 106 are shown wired to function as a bus. That is, a bus is formed by connecting each trace end (e.g. 107) to a die pad 108 with wire 109 and then to the next trace end (e.g. 110) with another wire 109.

Figure 14:
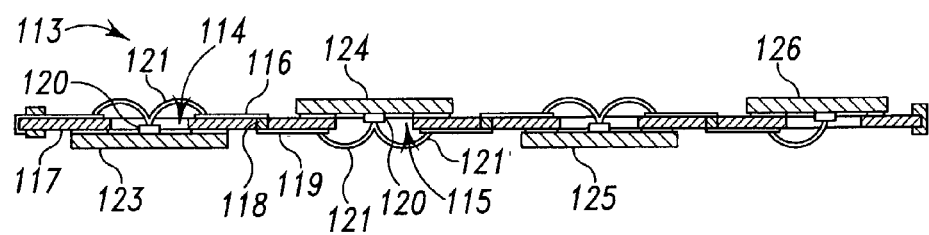
FIG. 14 is a side, cross-sectional view of an integrated circuit assembly 113 in accordance with another embodiment of the present invention.

Referring to FIG. 14, there is shown an alternative embodiment integrated circuit assembly 113 wherein, like circuit assembly 105, the traces are wired to function as a bus. Between each adjacent pair of openings (e.g. 114 and 115), a trace 116 on the top of substrate 117 is connected by a via 118 to a trace 119 on the bottom of substrate 117. The KGD's are mounted in alternating fashion on the top and bottom of substrate 117, and the die pad 120 of one KGD 123 is connected to the die pad 120 of the adjacent KGD 124 via wire 121, upper trace 116, via 118, lower trace 119 and another wire 121, as shown. All the KGD 123-126 may be wired in this manner, essentially along a common bus. Alternatively, the alternating trace configuration (i.e. 116 and 119) with the interconnecting via 118 may be connected to the KGD in any desired manner, be it a continuous bus or otherwise. An alternative embodiment is contemplated wherein a ground plane is embedded within substrate 19, between the top and bottom surface thereof, similar to ground trace 70 in FIG. 7. Such ground plane can be used to control the impedance of the vias and traces. Such ground plane may be made in any desired shape. For example, it may be made as narrow as trace 49 of FIG. 6 or as wide as the entire width of substrate 19 or any width or shape in between. Such ground plane would include insulated openings therein through which would extend one or more vias 118. One or more of the traces may be connected with such ground plane.

Figure 15:
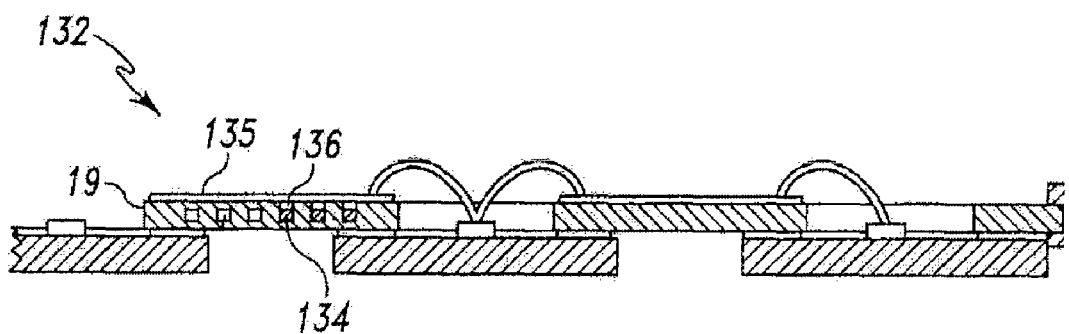
FIGS. 15-20 are side, cross-sectional views of integrated circuit assemblies in accordance with other embodiments of the present invention.

Referring to FIG. 15, there is shown an alternative embodiment integrated circuit assembly 132 like the circuit assembly 40 of FIG. 5, except are embedded in substrate 19 laterally extending traces 134 extend and connected as desired with the upper, longitudinally extending layer of traces 135 by the vias 136.

Figure 16:
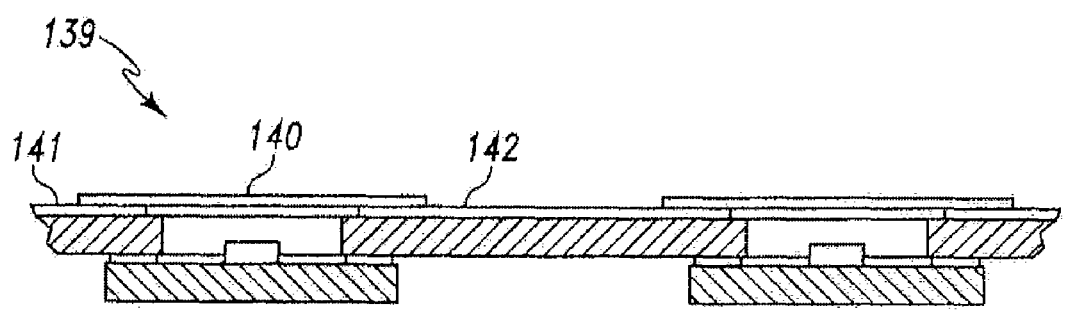
Figure 17:
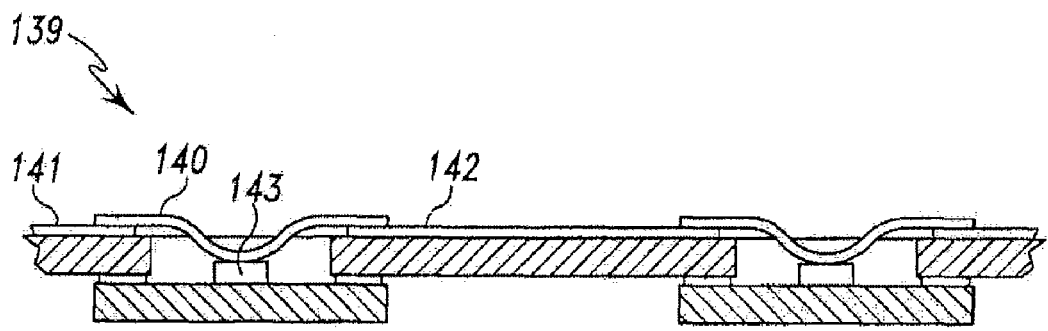

Embodiments described herein have included wires (e.g. wires 18 of FIG. 1) as interconnectors to connect traces to die pads or other traces. As used herein, interconnectors include any device, material or element suitable for providing electrical connection between one electrical die contact or trace and another electrical die contact or trace. Other interconnectors and methods of applying them are contemplated such as, and without limitation, laying down conductive polymers, adhesives or epoxies lithographically, and using a masking screen or a dispenser. Further alternative embodiments are shown in FIGS. 16-17. In the circuit assembly 139 shown in FIG. 16, a strip trace 140 is applied from one trace 141 to another trace 142 using ultrasonic bonding. In FIG. 17, the strip trace 140 is applied from one trace 141, down to a die pad 143 and back to the opposing adjacent trace 142.

Figure 18:
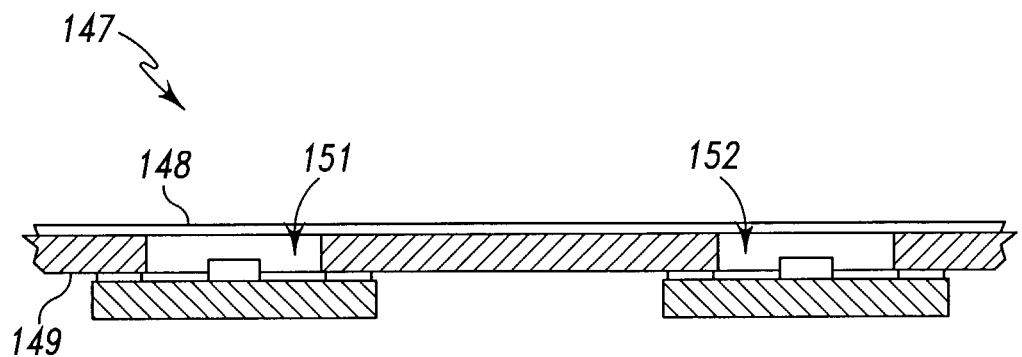
Figure 19:
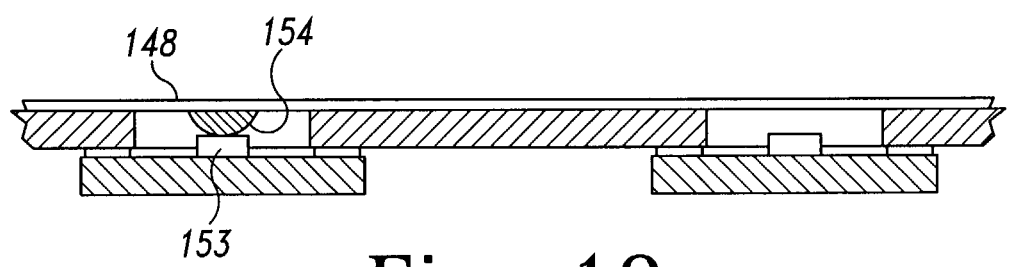
Figure 20:
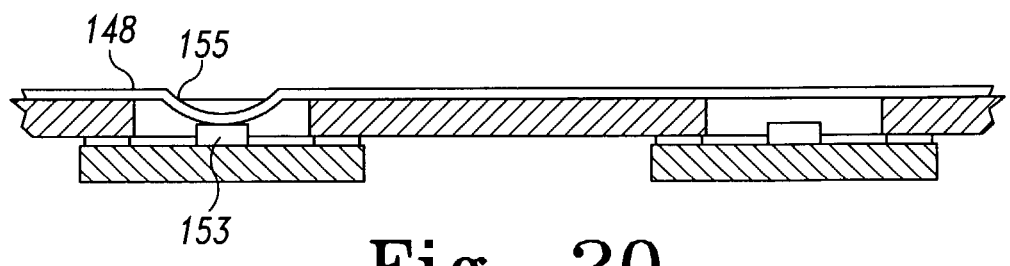

In FIGS. 18-20, an alternative circuit assembly 147 is shown wherein strip traces 148 are laid down along the length of the substrate 149 and directly over the various openings 151 and 152. Strip traces 148 are then bonded to the underlying die pads 153, as needed, using any appropriate method including wire bonding and other methods discussed herein. Other manners of connecting a strip trace 148 to a die pad 153 are contemplated, such as applying a conductive ball 154 (FIG. 19) or originally forming a bump 155 with the application of the strip trace 148 (FIG. 20) or, after application of strip trace 148 (as in FIG. 18), then deforming the strip trace 148 at the die pad location into a connective bump 155 (FIG. 20). Alternatively, bumps or balls may be formed directly on the die pads 153 (preferably before adhering the die to the substrate) where a connection to a trace is desired.

Figure 21:
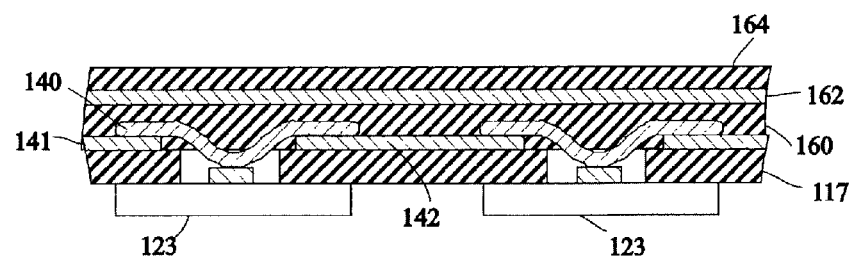
FIG. 21 illustrates addition of a conductive plane insulated from conductive traces and interconnect elements for controlling the impedance of the conductive traces and interconnect elements.

FIG. 21 illustrates the structure of FIG. 17 with a first insulating material 160 deposited over the traces 141 and interconnection elements 140. A conductive layer 162 is deposited over the first insulating material 160, and a second insulating material 164 is disposed over the conductive layer. The conductive layer 162 may be grounded or connected to a voltage source to control the impedance of traces 141 and interconnection elements 140. Alternatively, conductive layer 162 may not be connected to ground or a voltage source but may simply shield traces 141, interconnection elements 140, and dice 123. Indeed, the layers 160, 162, and 164 may encase a portion or even all of the assembly structure. In yet another alternative, conductive layer 162 may be a metallic casing attached to substrate 117. In such case, layer 164 may be dispensed with, and layer 160 may be air. Of course similar layers 160, 162, 164 may be applied to any of the embodiments described herein.

Figure 22:
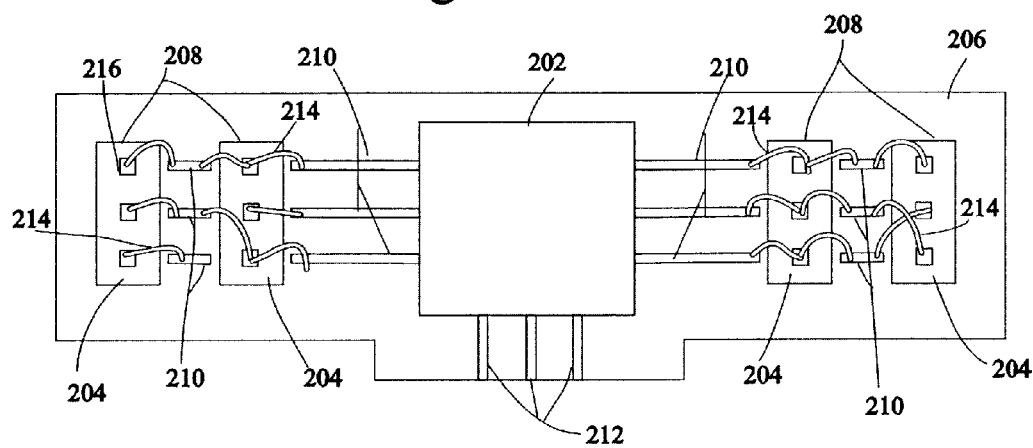
FIG. 22 illustrates a top view of an assembly of a system comprising different types of interconnected integrated circuits.
Figure 23:
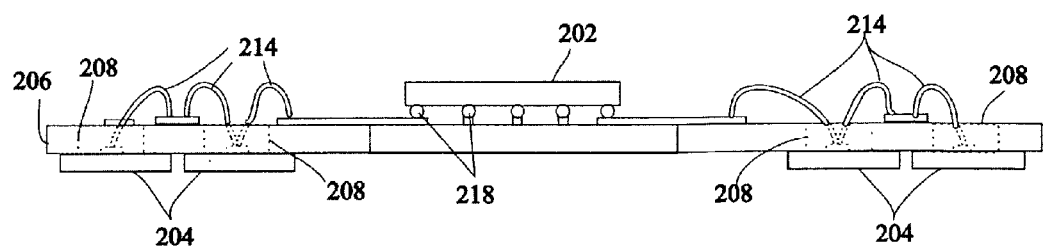
FIG. 23 illustrates a side view of the assembly of FIG. 22.

FIGS. 22 and 23 illustrate an embodiment in which a microprocessor 202 is connected to traces 210 and 212 on substrate 206 (having openings 208) by solder balls 218. Four memory dice 204 (having die pads 216) are connected to the microprocessor 202 by interconnect elements 214 and traces 210, as shown in FIGS. 22 and 23. Of course, FIGS. 22 and 23 illustrate but one example of a system in which different types of dice are assembled to form an electronic system. Radio frequency dice, analog dice, logic dice, or any other type of dice may be assembled and interconnected to form such a system.

Figure 24:
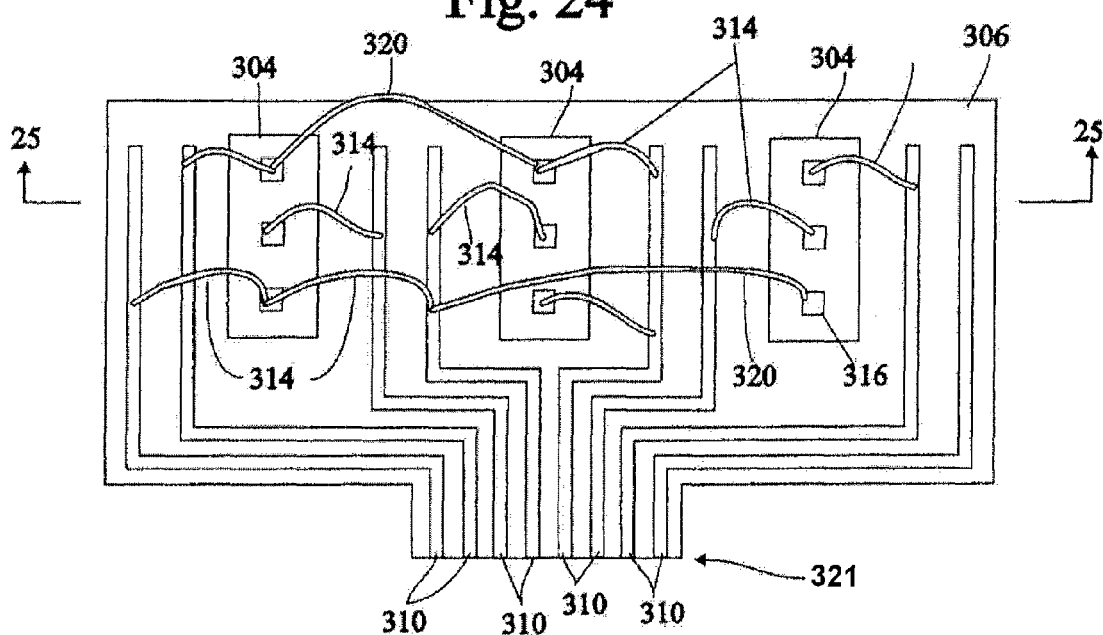
FIG. 24 illustrates a top view of an assembly in which interconnections are made from one integrated circuit directly to another integrated circuit.
Figure 25:
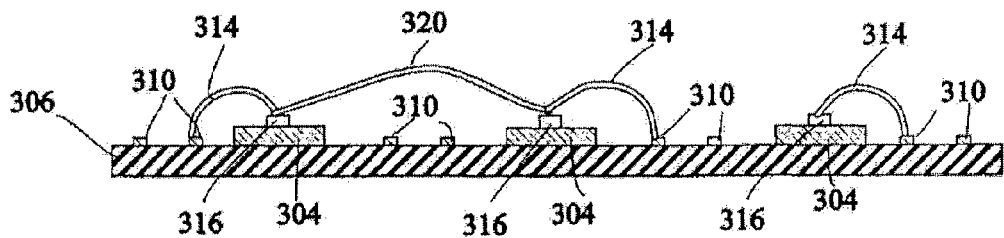
FIG. 25 illustrates a cross-sectional side view of the assembly of FIG. 24.

FIGS. 24 and 25 illustrate, an embodiment in which dice 304 are adhered to the surface of a substrate 306. Traces 310 run from a connection edge 321 to spaces beside the dice 304. Interconnect elements 314 connect terminals 316 on the dice 304 to traces 310. In addition, some interconnect elements 320 directly connect a terminal 316 on one die 304 to a terminal 316 on another die.

Figure 26:
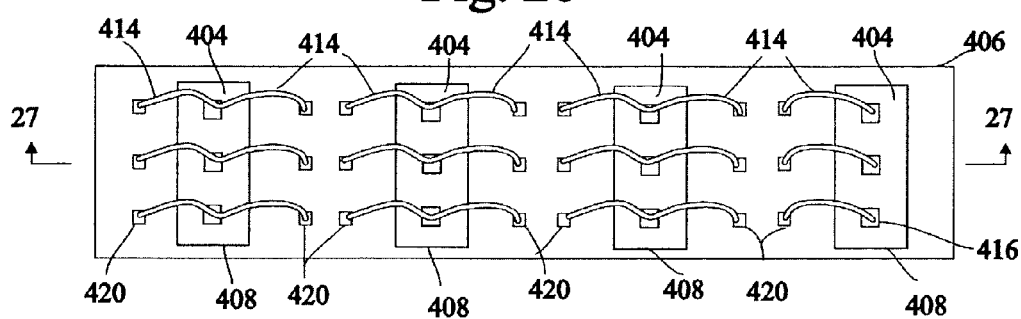
FIG. 26 illustrates a top view of an embodiment of the invention which interconnects are bonded from terminals on a die to vias in a substrate.
Figure 27:
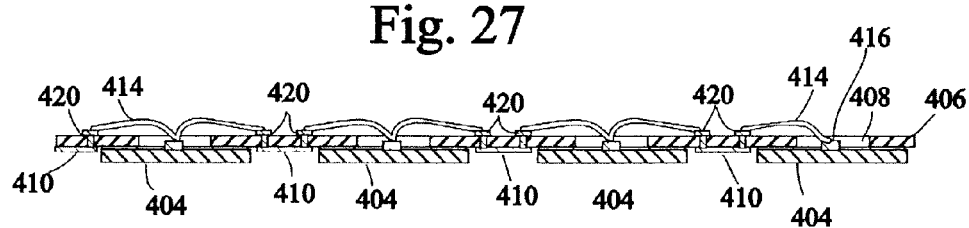
FIG. 27 illustrates a cross-sectional side view of the assembly of FIG. 26.

FIGS. 26 and 27 illustrate yet another embodiment in which the traces 410 between openings 408 in the substrate 406 are disposed on the underside of the substrate (that is, the side to which the dice 404 are adhered). Interconnect elements 414 connect terminals 416 on the dice 404 to vias 420 that pass through the substrate 406 to the traces 410, as shown in FIGS. 26 and 27.

While the invention has been illustrated and described in detail in the drawings and foregoing description, the same is to be considered as illustrated and not restrictive in character, it being understood that only the preferred embodiment has been shown and described and that all changes and modifications that come within the spirit of the invention are desired to be protected. The articles "a", "an", "said" and "the" are not limited to a singular element, and include one or more such element.

What is claimed is:

1. An integrated circuit assembly comprising:
   a substrate comprising a plurality of electrically conductive traces and a plurality of openings;
   a plurality of dice attached to said substrate, input and/or output terminals of said dice positioned with in said openings;
   a plurality of electrically conductive bonded wires, each wire of ones of said wires is bonded at a first end of said wire to one of said traces and bonded at a second end of said wire to a terminal of one of said dice,
   wherein:
   a first group of ones of said wires and at least one of said traces are connected one to another, forming a first electrical interconnection electrically connecting terminals of at least two of said dice, and
   a second group of ones of said wires and at least one of said traces are connected, forming a second electrical interconnection electrically connecting terminals of at least two of said dice; and
   additional groups of ones of said wires and at least one of said traces that are connected such that each group forms an additional electrical interconnection electrically connecting terminals of at least two of said dice, wherein ones of said first electrical interconnection, said second electrical interconnection, and said additional electrical interconnections compose a data bus structure interconnecting ones of said dice.

2. The assembly of claim 1, wherein said bonded wires are custom placed to customize interconnections among said traces and dice.

3. The assembly of claim 1, wherein said wire is structurally distinct from said traces.

4. An integrated circuit assembly for a plurality of dice, comprising:
   a substrate;
   a first opening in said substrate;
   a second opening in said substrate;
   a first die attached to said substrate and having a first input and/or output die contact positioned within said first opening;
   a second die attached to said substrate and having a second input and/or output die contact positioned within said second opening;
   a first electrically conductive trace attached to said substrate, wherein said first opening is disposed between said first conductive trace and said second opening;
   a first electrically conductive interconnector electrically connecting said first trace and said first die contact; and
   a second electrically conductive interconnector electrically connecting said first trace and said second die contact, said second conductive interconnector is disposed at least in part above said first opening,
   wherein said first trace, said first interconnector, and said second interconnector are each structurally distinct one from another.

5. The assembly of claim 4 wherein:
   said first die comprises a plurality of said first die contacts, each positioned within said first opening; and
   said second die comprises a plurality of said second die contacts, each positioned within said second opening;
   said assembly further comprising:
   a plurality of said first traces attached to said substrate;
   a plurality of said first interconnectors, each connecting one of said first traces to one of said first die contacts; and
   a plurality of said second interconnectors, each connecting one of said first traces to one of said second die contacts.

6. The assembly of claim 5, wherein each of said plurality of first traces are substantially parallel.

7. The assembly of claim 5, wherein each of said plurality of first traces are substantially equal in length.

8. The assembly of claim 5, wherein each of said plurality of first traces have substantially the same impedance.

9. The assembly of claim 4 further comprising:
   a third die attached to said substrate; and
   means for electrically connecting said third die to at least one of said first die contact, said second die contact, and said first trace.

10. The assembly of claim 9, wherein at least one of said first die, said second die, and said third die comprises an integrated circuit that is different than an integrated circuit of said others of said first die, said second die, and said third die.

11. The assembly of claim 9, wherein said first die and said second die comprise digital memory circuits, and said third die comprises a microprocessor circuit.

12. The assembly of claim 4, wherein said first die comprises an integrated circuit that is different than an integrated circuit of said second die.

13. The assembly of claim 4, wherein said first die comprises a digital memory circuit and said second die comprises a microprocessor circuit.

14. The assembly of claim 4, wherein said first trace is embedded in said substrate and projects from said substrate into said first opening.

15. The assembly of claim 4 wherein said first die and said second die are attached to said substrate on opposite sides of said substrate.

16. The assembly of claim 4, wherein said first interconnector comprises a wire, a first end of said wire is bonded to said first trace and a second end of said wire is bonded to said first die contact.

17. The assembly of claim 16, wherein said second interconnector comprises a second wire, a first end of said second wire is bonded to said first trace and a second end of said second wire is bonded to said second die contact.

18. The assembly of claim 4 wherein said substrate comprises a thin, flexible substrate film.

19. The assembly of claim 4 further comprising means for electrically shielding said first trace, said first interconnector, and said second interconnector.

20. The assembly of claim 4 further comprising means for controlling an impedance of said first trace, said first interconnector, and said second interconnector.

21. The assembly of claim 4, wherein said first die and said second die are unpackaged.

* * * * *